United States Patent [19]
Hasegawa et al.

[11] Patent Number: 5,374,591
[45] Date of Patent: Dec. 20, 1994

[54] METHOD OF MAKING A METAL PLUG

[75] Inventors: Toshiaki Hasegawa, Kanagawa; Junichi Sato, Tokyo, both of Japan

[73] Assignee: Sony Corporation, Tokyo, Japan

[21] Appl. No.: 856,115

[22] Filed: Mar. 23, 1992

[30] Foreign Application Priority Data

Mar. 22, 1991 [JP] Japan .................................. 3-058931

[51] Int. Cl.[5] ........................................ H01L 21/441
[52] U.S. Cl. .................................... 437/187; 437/192; 437/195; 437/981
[58] Field of Search ............... 437/981, 192, 187, 195; 148/DIG. 161

[56] References Cited

FOREIGN PATENT DOCUMENTS

| 84024 | 4/1986 | Japan | 437/981 |
| 182839 | 7/1988 | Japan | 437/981 |
| 280317 | 11/1989 | Japan | 437/981 |

Primary Examiner—John S. Maples
Attorney, Agent, or Firm—Hill, Steadman & Simpson

[57] ABSTRACT

A metal plug is formed in a connection hole such as a via hole or a contact hole to provide an interconnection between multilayer wires in a semiconductor integrated circuit. First, an adhesion layer is deposited on an insulating film, and an area of the adhesion layer is etched away isotropic etching through an opening in a resist mask, the area being larger than the opening in the resist mask. Thereafter, the insulating film is etched through the opening in the resist mask by anisotropic etching, forming a connection hole in the insulating film. Then, a metal layer such as a blanket tungsten layer is deposited on the adhesion layer and in the connection hole. The metal layer is etched back and the adhesion layer is etched away, leaving the metal layer as a metal plug in the connection hole.

10 Claims, 7 Drawing Sheets

METHOD OF MAKING A METAL PLUG

BACKGROUND OF THE INVENTION

1. Field of the Invention

The present invention relates to a method of making a metal plug, and more particularly to a method of embedding a metal plug or connector of a metal of high melting point in a via hole, or a plated through hole, which interconnects several layers of multilayer wires on a semiconductor integrated circuit or a contact hole which interconnects a semiconductor substrate and a wire.

2. Description of the Prior Art

Semiconductor integrated circuits such as USLI circuits are composed of a large number of circuit components and interconnections that are packed in very small size and with very high density. On those integrated circuits, the via holes which provide interconnections between layers of multilayer wires and the contact holes which interconnect semiconductor substrates and wires have diameters that are as small as 0.35 μm. The conventional bias sputtering process for producing interconnections of Al fails to provide good interconnections between those connection holes in terms of step coverage.

Metal plugs have been proposed and put to use in order to improve the step coverage with respect to such interconnections between such small via holes and contact holes. Metal plugs are selectively embedded in via holes and contact holes. One of the metal plugs that has drawn much attention in the art is made of CVD blanket tungsten that provides good coverage and has a lower contact resistance than plugs of polycrystalline silicon.

FIGS. 1A through 1C of the accompanying drawings show a conventional method of interconnecting wires with a metal plug.

First, as shown in FIG. 1A, a lower wire 2 is formed as a diffused layer in a silicon substrate 1, and then an insulating film 3 of SiO$_2$, for example, is deposited on the upper surface of the silicon substrate 1. After a connection hole 4 for providing an electric interconnection is formed in the insulating film 3, a film 5 of TiN, for example, is deposited as an adhesion layer on the entire surface of the insulating film 3 including the connection hole 4.

Then, as shown in FIG. 1B, a layer of a metal of high melting point such as a blanket tungsten layer 6 is deposited on the film 5 by CVD.

Thereafter, as shown in FIG. 1C, the blanket tungsten layer 6 and the film 5 are etched back to leave the tungsten as a metal plug 6A and the film 5 only in the connection hole 4. Then, an upper wire 7 is deposited on the insulating film 3 so as to be connected to the metal plug 6A.

A film 8 of TiSi$_2$ may be deposited as a heat resistant layer on the surface of the diffused lower wire 2 by SITOX (silicization through oxide).

According to the conventional process, it is necessary to provide the TiN film 5 as an adhesion layer between the CVD blanket tungsten layer 6 and the insulating film 3 for better adhesion therebetween. When the blanket tungsten layer 6 is etched back and also the TiN film 5 is etched, overetching is required to ensure sufficient removal of the materials. However, since the etchant concentrates on the TiN film 5 on the side wall of the connection hole 4, the TiN 5 is considerably overetched as shown in FIG. 2 of the accompanying drawings. Consequently, the upper wire 7 which will subsequently be deposited may not reliably be formed over the metal plug 6A.

One solution is not to deposit an adhesion layer on the side wall of the connection hole 4, as shown in FIGS. 3A and 3B of the accompanying drawings. More specifically, as shown in FIG. 3A, after an insulating layer 3 and then a TiN film 5 as an adhesion layer have been deposited, a connection hole 4 is formed which extends to the lower wire 2. However, when a blanket tungsten layer 6 is subsequently deposited, as shown in FIG. 3B, an overhang 9 of the layer 6 is caused of necessity, making it difficult to embed the blanket tungsten layer 6 without any void 10 in the connection hole 4. Such a void 10 is more likely to occur as the connection hole 4 is smaller because the TiN film 5 and the blanket tungsten layer 6 on the insulating layer 3 as of SiO$_2$ have different growth rates. The overhang may be prevented from taking place by effecting isotropic etching on the TiN film 5. However, the isotropic etching of the TiN film 5 is not practical since it is difficult to carry out.

OBJECTS AND SUMMARY OF THE INVENTION

In view of the aforesaid drawbacks of the conventional methods of making a metal plug, it is an object of the present invention to provide a method of making a metal plug for semiconductor integrated circuits of small size and high packing density.

According to the present invention, there is provided a method of making a metal plug in a connection hole in an insulating film, comprising the steps of depositing an adhesion layer on a surface of an insulating film, etching away an area of the adhesion layer by isotropic etching through an opening in a resist mask, the area being larger than the opening in the resist mask, thereafter etching the insulating film through the opening in the resist mask by anisotropic etching, forming a connection hole in the insulating film, depositing a metal layer on the adhesion layer and in the connection hole, and etching back same metal layer, leaving the metal layer as a metal plug in the connection hole.

As described above, the area of the adhesion layer which is larger than the opening in the resist mask is etched away by isotropic etching, and then the connection hole is formed in the insulating film by anisotropic etching, after which the metal plug is formed in the connection hole. No overhang of the metal layer is produced over the edge of the connection hole, allowing the metal layer to be embedded in the connection hole without any void therein. Therefore, when the metal layer is etched back, the metal plug is reliably formed in the connection hole. The metal layer may be embedded in the connection hole without concern over the coverage of the adhesion layer. After the metal layer is etched back, the adhesion layer is etched away by sufficient overetching. Therefore, the metal plug thus formed is highly reliable.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

FIGS. 4A through 4F illustrate a method of making a metal plug according to an embodiment of the present invention.

Figure 1A:
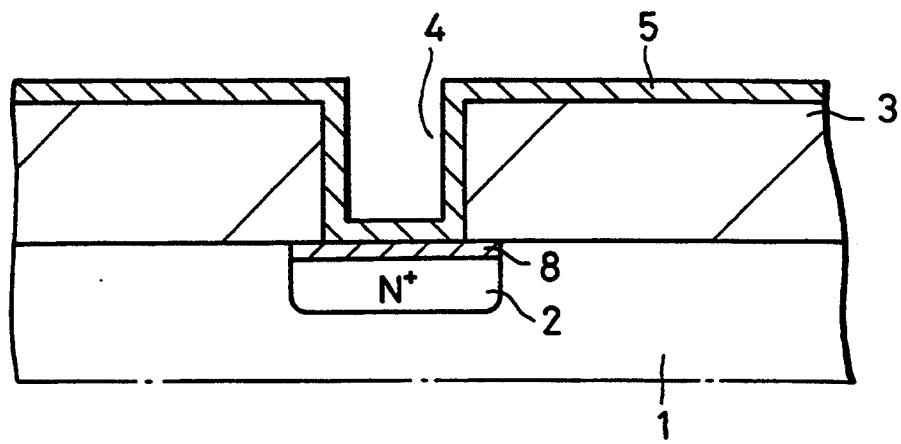
FIGS. 1A through 1C are fragmentary cross-sectional views illustrative of a conventional method of making a metal plug.
Figure 1B:
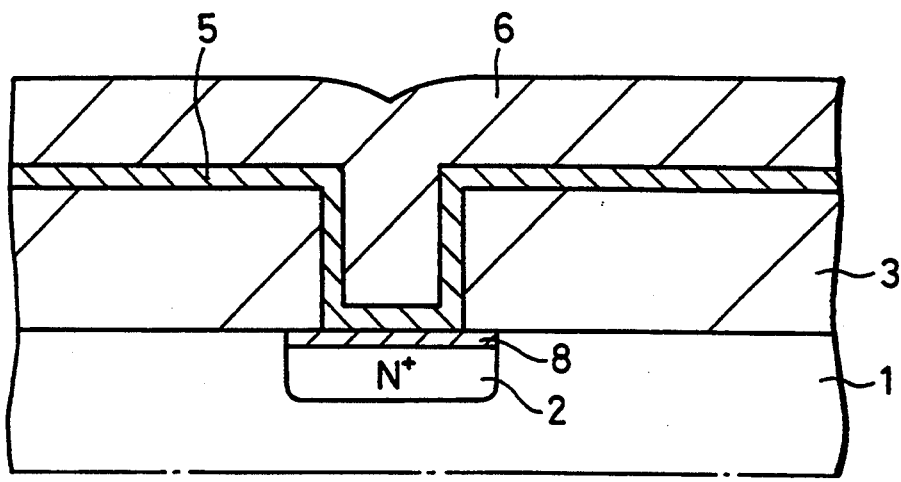
Figure 1C:
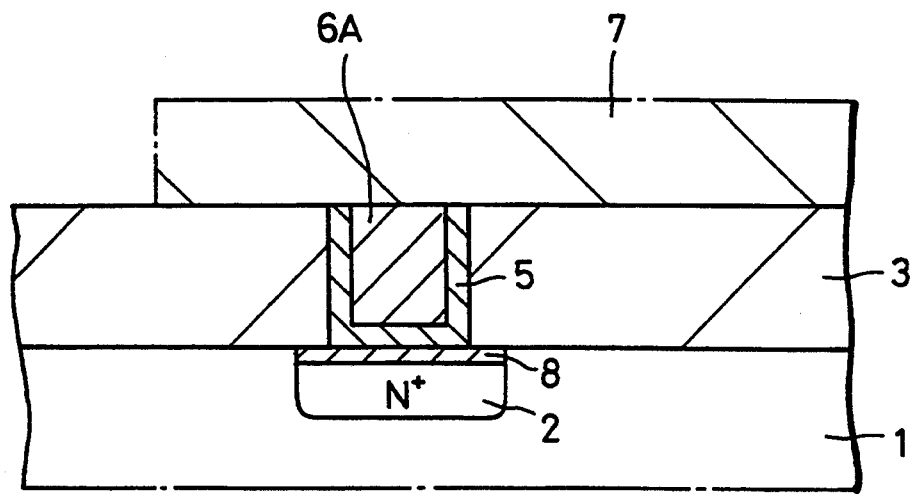
Figure 2:
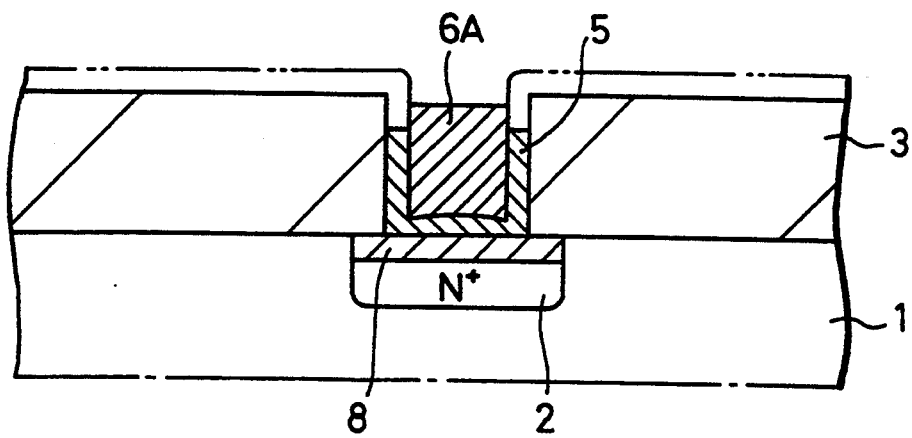
FIG. 2 is a fragmentary cross-sectional view illustrative of a conventional method of making a metal plug.
Figure 3A:
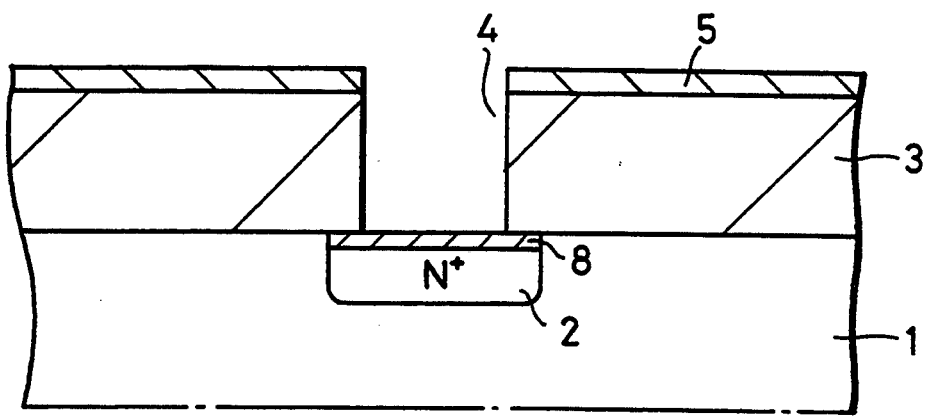
FIG. 3 is a fragmentary cross-sectional view illustrative of a conventional method of making a metal plug.
Figure 3B:
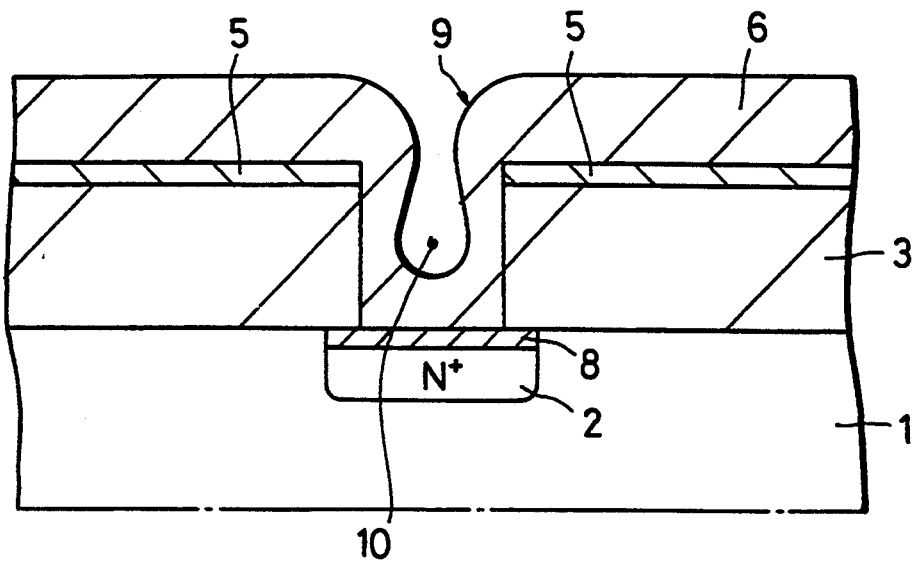
Figure 4A:
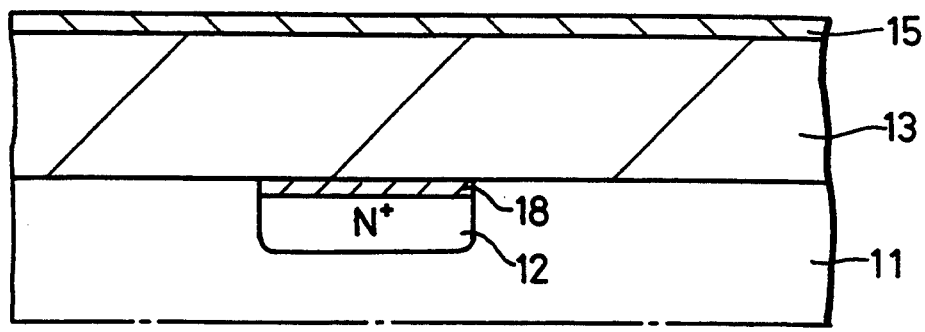
FIGS. 4A through 4F are fragmentary cross-sectional views illustrative of a method of making a metal plug according to an embodiment of the present invention.

As shown in FIG. 4A, a lower wire 12 is formed as a diffused layer in one surface of a semiconductor substrate 11. A $TiSi_2$ film 18 is deposited as a heat resistant layer on the surface of the diffused lower wire layer 12 by SITOX. Then, an insulating film 13 of $SiO_2$ or the like is deposited on the semiconductor substrate 11 including the $TiSi_2$ film 18, and thereafter an adhesion layer 15 such as a Ti film or a TiN film is deposited on the insulating film 13 under normal conditions.

Figure 4B:
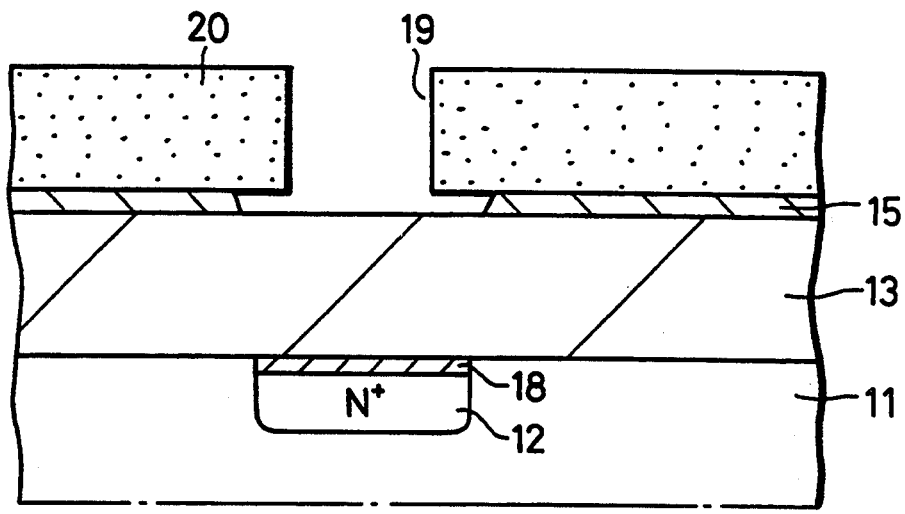
Figure 4C:
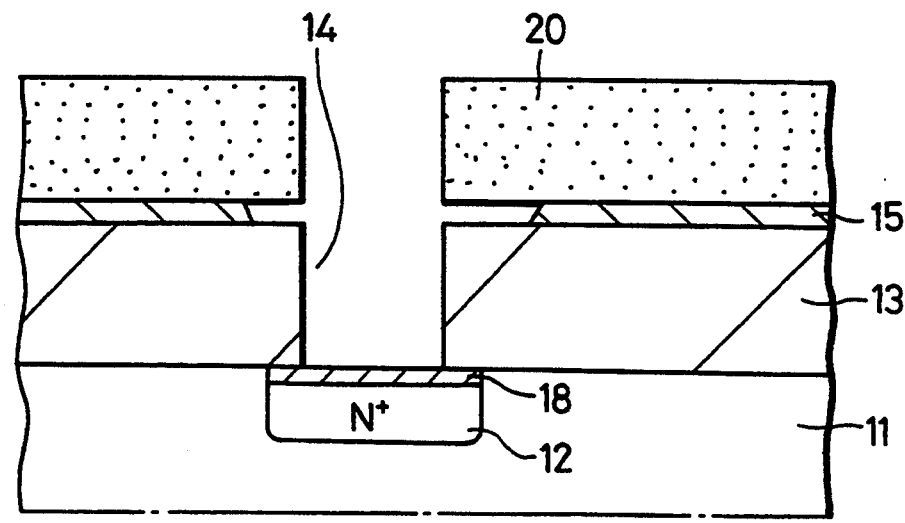

Then, as shown in FIG. 4B, the adhesion layer 15 is isotropically etched by dry etching through a resist mask 20 having an opening 19, after which the insulating film 13 is anisotropically etched through the resist mask 20, forming a connection hole 14 extending down to the lower wire 12, as shown in FIG. 4C.

If the adhesion layer 15 comprises a Ti film, then it may be isotropically etched, for example, with 50 SCCM of a $Cl_2$ gas under a pressure of 0.05 Torr with a power of 0.08 $W/cm^2$ at a temperature of 100° C. If the adhesion layer 15 comprises a TiN film, then it is isotropically etched primarily with a Cl radical, and may be isotropically etched, for example, with 30 SCCM of a $Cl_2$ gas under a pressure of 0.6 Torr with a power of 0.2 $W/cm^2$. In this manner, the adhesion layer 15 is etched away from an area which covers the connection hole 14 and has its outer edge spaced about 0.2 $\mu m$ from the edge of the connection hole 14.

The insulating film 13 such as an $SiO_2$ film is anisotropically etched by RIE (reactive ion etching), and may be etched, for example, with 80 SCCM of a $CHF_3$ gas under a pressure of 0.05 Torr with a power of 0.25 $W/cm^2$.

Figure 4D:
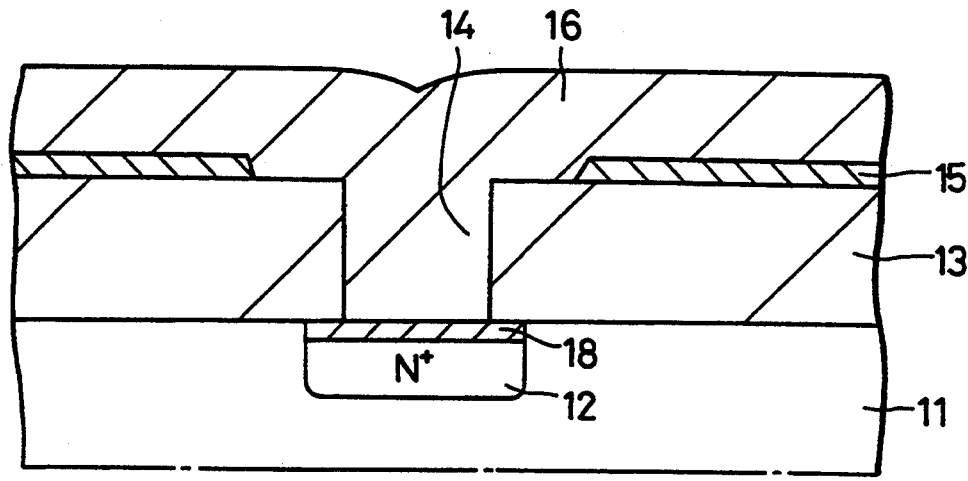

Then, the resist mask 20 is removed, and the surface formed so far is washed if necessary. Thereafter, as shown in FIG. 4D, a layer of a metal of high melting point, such as a blanket tungsten layer 16, is deposited on the surface formed so far by CVD so that the connection hole 14 is filled with the blanket tungsten layer 16. At this time, the blanket tungsten layer 16 may be deposited with a gas of 30 SCCM of $WF_6$ and 360 SCCM of $SiH_4$ under a pressure of 80 Torr at a temperature of 475° C. Alternatively, the blanket tungsten layer 16 may be deposited by a two-stage CVD process. For example, in the first CVD stage, it may be deposited with a gas of 25 SCCM of $WF_6$ and 15 SCCM of $SiH_4$ under a pressure of 80 Torr at a temperature of 475° C., and in the second CVD stage, it may be deposited with a gas of 60 SCCM of $WF_6$ and 360 SCCM of $H_2$ under a pressure of 80 Torr at a temperature of 475° C. Since the adhesion layer 15 has been selectively etched away from the connection hole 14 and its outer edge region, no overhang of the blanket tungsten layer 16 is formed on the shoulder of the connection hole 14. Therefore, no void is formed in the blanket tungsten layer 16 filled or embedded in the connection hole 14.

Figure 4E:
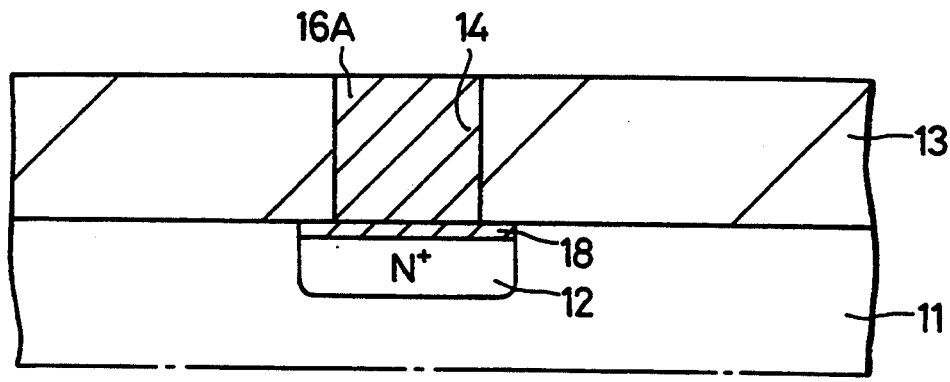

Thereafter, as shown in FIG. 4E, the blanket tungsten layer 16 is etched back, leaving the blanket tungsten layer 16 as a metal plug 16A only in the connection hole 14. The blanket tungsten layer 16 may be etched back with a gas of 30 SCCM of $SF_6$ and 20 SCCM of $Cl_2$ under a pressure of 0.015 Torr with a power of 0.25 $W/cm_2$. After the blanket tungsten layer 16 is etched back, the adhesion layer 15 is etched away from the insulating film 13. If the adhesion layer 15 is in the form of a Ti film, it may be etched away with 50 SCCM of a $Cl_2$ gas under a pressure of 0.05 Torr with a power of 0.08 $W/cm^2$ at a temperature of 100° C. In this etching mode with a strong Cl radical, no tungsten is etched away, but only Ti is selectively etched away.

Figure 4F:
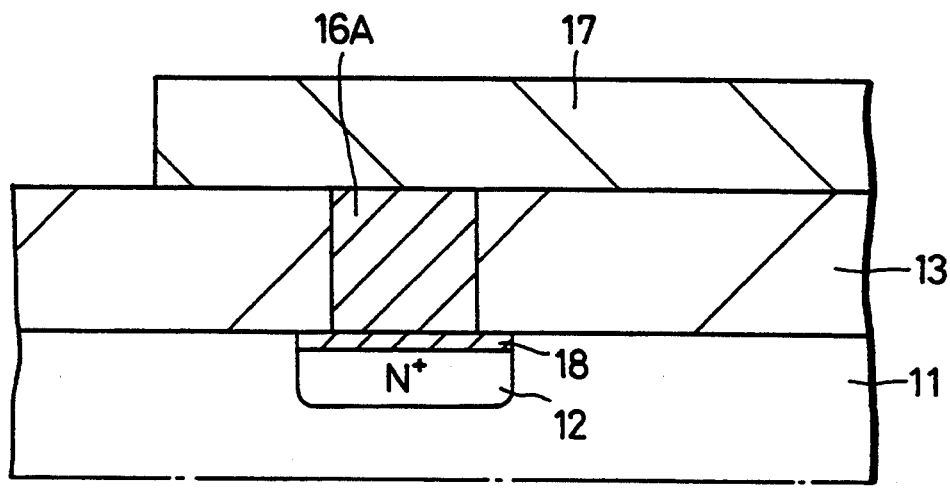

Thereafter, as shown in FIG. 4F, an upper wire 17 of aluminum, tungsten, or the like is deposited in a predetermined pattern on the insulating film 13 so as to be connected to the metal plug 16A. In this fashion, multilayer wires are fabricated.

In the steps shown in FIGS. 4D and 4E, the adhesion layer 15 is etched away after the blanket tungsten layer 16 is etched back. However, after the blanket tungsten layer 16 is etched back, the adhesion layer 15 of Ti may be etched at an etching rate which is the same as the etching rate of the blanket tungsten layer 16 with a gas of 30 SCCM of $Cl_2$ and 20 SCCM of $N_2$ under a pressure of 0.015 Torr with a power of 0.25 $W/cm_2$, thus forming the metal plug 16A with its upper surface lying flush with the surface of the insulating film 13, as shown in FIG. 4E.

In this embodiment, after the adhesion layer 15 is deposited on the insulating film 13, only the adhesion layer 15 is selectively etched laterally off the connection hole 14 by isotropic etching through the resist mask 20, and thereafter the insulating film 15 is etched by anisotropic etching through the same resist mask 20. Therefore, when the blanket tungsten layer 16 is subsequently deposited, no overhang is produced over the edge of the connection hole 14, allowing the blanket tungsten layer 16 to be filled or embedded in the connection hole 14 without any void therein. Since no adhesion layer is provided on the side wall of the connection hole 14 when the blanket tungsten layer 16 is etched back, the adhesion layer 15 is prevented from overetching, so that the subsequently formed upper wire 17 will reliably be formed over the metal plug 16A. Therefore, the metal plug 16A is highly reliably held in electric connection to the upper wire 17.

Figure 5:
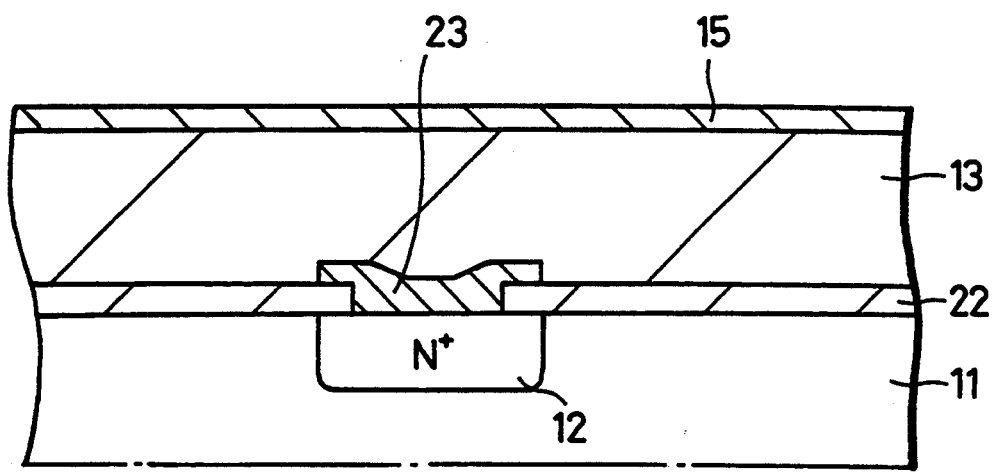
FIG. 5 is a fragmentary cross-sectional view illustrative of a method of making a metal plug according to another embodiment of the present invention.

In the above process shown in FIGS. 4A through 4F, the lower wire 12 is formed as a diffused layer in the surface of the semiconductor substrate 11, the $TiSi_2$ film 18 is deposited on the contact surface of the diffused lower wire 12, and then the insulating film 13 of $SiO_2$ or the like and the adhesion layer 14 are successively deposited on the semiconductor substrate 11 and the $TiSi_2$ film 18. However, as shown in FIG. 5, after the lower wire 12 is formed as a diffused layer in the surface of the semiconductor substrate 11, an insulating film 22 of $SiO_2$ or the like may be deposited on the semiconductor substrate 11. Then, the region of the insulating film 22 which corresponds to the contact surface of the lower wire 12 may then be removed, and a Ti/TiN film 23 may be deposited in the removed region and on the edge of insulating film 22 around the removed region, after which the insulating film 13 and the adhesion layer 15 may successively be deposited.

FIGS. 6A through 6F show a method of making a metal plug according to still another embodiment of the present invention. According to the method shown in FIGS. 6A through 6F, in the case where a Ti film used as the adhesion layer has a relatively low adhesion capability, the Ti film is processed into a TiN film for an increased adhesion capability.

Figure 6A:
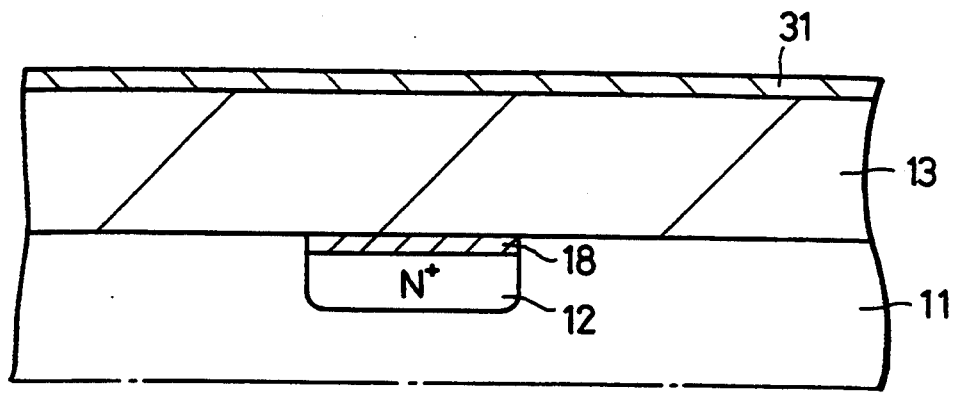
FIGS. 6A through 6F are fragmentary cross-sectional views illustrative of a method of making a metal plug according to still another embodiment of the present invention.

As shown in FIG. 6A, a lower wire 12 is formed as a diffused layer in one surface of a semiconductor substrate 11. A $TiSi_2$ film 18 is deposited as a heat resistant layer on the contact surface of the diffused lower wire layer 12. Then, an insulating film 13 of $SiO_2$ or the like is deposited on the semiconductor substrate 11 including the $TiSi_2$ film 18, and thereafter an adhesion layer 31 such as a Ti film or a TiN film is deposited on the insulating film 13.

Figure 6B:
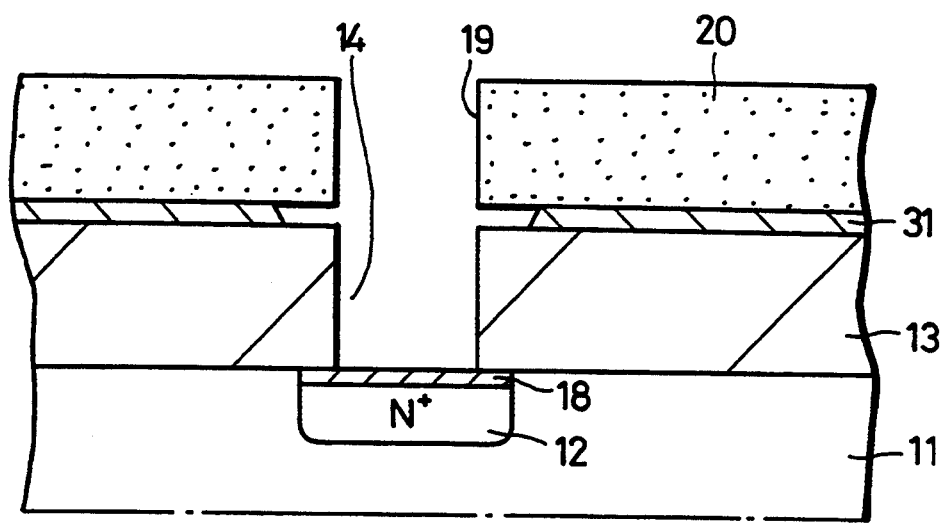

Then, as shown in FIG. 6B, the adhesion layer 31 is isotropically etched through a resist mask 20 to form an open area larger than a connection hole 14 to be subsequently formed. Thereafter, the insulating film 13 is anisotropically etched through the resist mask 20 by RIE, forming a connection hole 14. If the adhesion layer 31 comprises a Ti film, then it may be isotropically etched, for example, with 30 SCCM of a $Cl_2$ gas under a pressure of 0.6 Torr with a power of 0.25 W/cm². The insulating film 13 such as an $SiO_2$ film may be etched, for example, with 80 SCCM of a $CHF_3$ gas under a pressure of 0.05 Torr with a power of 0.25 W/cm².

Figure 6C:
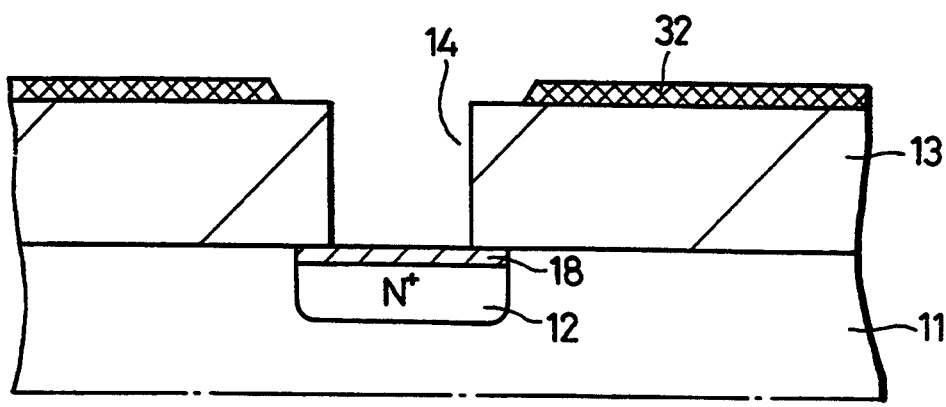

Then, after the resist mask 20 is removed, the Ti film 31 is nitrided into a TiN film 32 by ammonium annealing at a temperature of about 800° C., as shown in FIG. 6C.

Figure 6D:
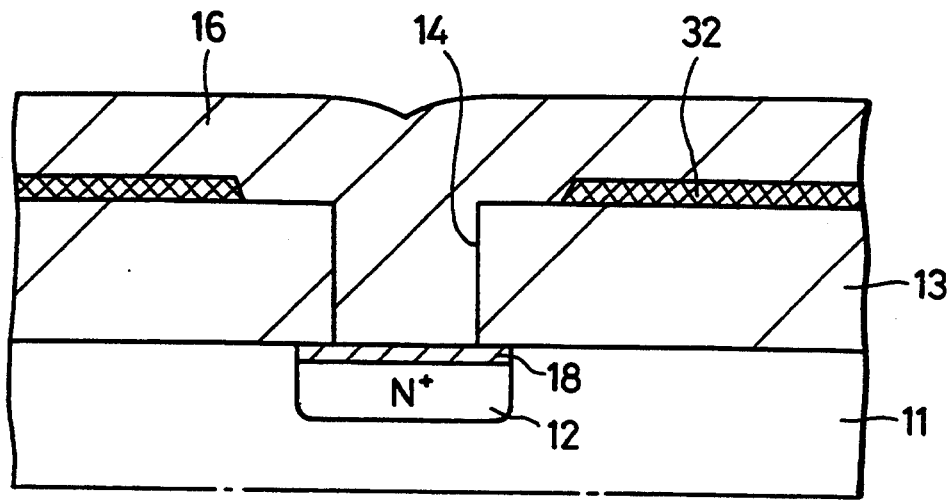

Then, as shown in FIG. 6D, a blanket tungsten layer 16 is deposited on the surface formed so far by CVD so that the connection hole 14 is filled with the blanket tungsten layer 16. At this time, the blanket tungsten layer 16 may be deposited at a first CVD stage with a gas of 25 SCCM of $WF_6$ and 15 SCCM of $SiH_4$ under a pressure of 80 Torr at a temperature of 475° C., and at a second CVD stage with a gas of 60 SCCM of $WF_6$ and 360 SCCM of $H_2$ under a pressure of 80 Torr at a temperature of 475° C.

Figure 6E:
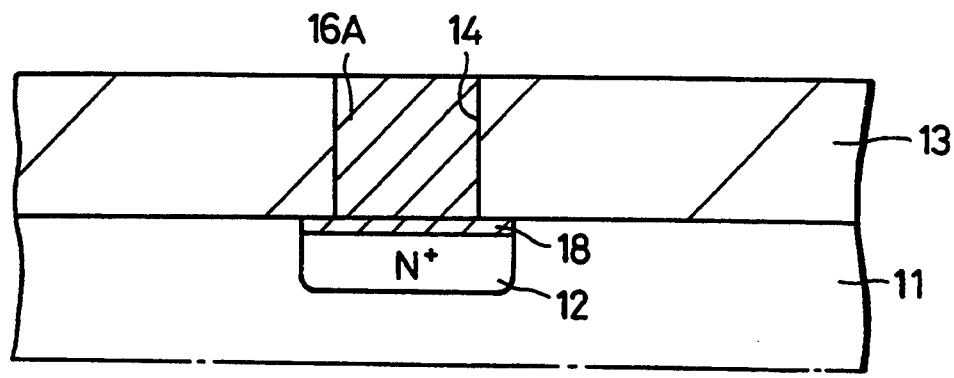
Figure 6F:
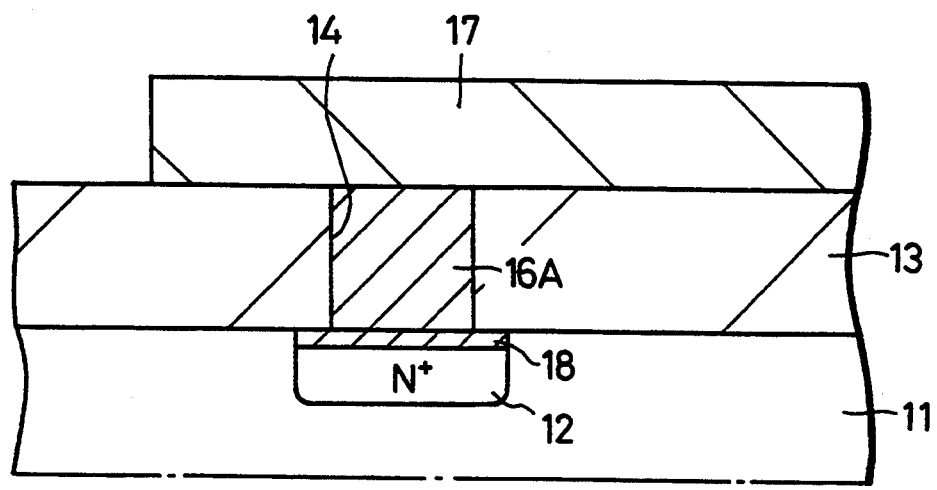

Thereafter, as shown in FIG. 6E, the blanket tungsten layer 16 is etched back, leaving the blanket tungsten layer 16 as a metal plug 16A only in the connection hole 14. Then, an upper wire 17 is deposited in a predetermined pattern on the insulating film 13 so as to be connected to the metal plug 16A, as shown in FIG. 6F, thus completing multilayer wires.

In this embodiment, since the TiN film 32 is etched laterally off the marginal edge of the connection hole 14, any overhang is prevented from occurring over the edge of the connection hole 14 when the blanket tungsten layer 16 is subsequently deposited. Therefore, the blanket tungsten layer 16 is fully filled or embedded in the connection hole 14 without any void therein. The blanket tungsten layer 16 can be embedded in the connection hole 14 without concern over the coverage of the TiN film 32. After the blanket tungsten layer 16 is etched back, the TiN film 32 can sufficiently be overetched without taking account of the connection hole 14, so that the metal plug 16A is formed highly reliably.

In the above embodiments, the connection hole 14 is formed in the insulating film 13 by anisotropic etching after the adhesion layer 15 or the Ti film 31 is isotropically etched. However, the connection hole 14 may be formed in the insulating film 13 by isotropic etching after the adhesion layer 15 or the Ti film 31 may be anisotropically etched.

While the lower wire 12 is formed as a diffused layer in each of the above embodiments, the present invention is equally applicable to lower wires of other configurations.

The methods according to the present invention are effective to make metal plugs in via holes and contact holes.

Having described preferred embodiments of the invention with reference to the accompanying drawings, it is to be understood that the invention is not limited to that precise embodiments and that various changes and modifications could be effected by one skilled in the art without departing from the spirit or scope of the invention as defined in the appended claims.

What is claimed is:

1. A method of making a metal plug in a connection hole in an insulating film, comprising the steps of:
   depositing an adhesion layer on a surface of an insulating film;
   etching away an area of said adhesion layer by isotropic etching through an opening in a resist mask, said area being larger than said opening in the resist mask;
   thereafter etching said insulating film through the opening in the resist mask by anisotropic etching, forming a connection hole in said insulating film; which has a substantially constant width;
   depositing a metal layer on said adhesion layer and in said connection hole; and
   etching back said metal layer, leaving the metal layer as a metal plug in said connection hole which substantially fills the hole and wherein the plug has a flat top.

2. A method Of making a metal plug in a connection hole in an insulating film, comprising the steps of:
   depositing an adhesion layer on a surface of an insulating film;
   etching away an area of said adhesion layer by isotropic etching through an opening in a resist mask, said area being larger than said opening in the resist mask;
   thereafter etching said insulating film through the opening in the resist mask by anisotropic etching, forming a connection hole in said insulating film;
   depositing a metal layer on said adhesion layer and in said connection hole; and etching back said metal layer, leaving the metal layer as a metal plug in said connection hole, and wherein said adhesion layer is made of Ti.

3. A method according to claim 2, further including the step of:
   nitriding said adhesion layer of Ti into an adhesion layer of TiN.

4. A method of making a metal plug in a connection hole in an insulating film, comprising the steps of:
   depositing an adhesion layer on a surface of an insulating film;

etching away an area of said adhesion layer by isotropic etching through an opening in a resist mask, said area being larger than said opening in the resist mask;

thereafter etching said insulating film through the opening in the resist mask by anisotropic etching, forming a connection hole in said insulating film;

depositing a metal layer on said adhesion layer and in said connection hole; and etching back said metal layer, leaving the metal layer as a metal plug in said connection hole, and wherein said adhesion layer is deposited as a Ti film and etched with 50 SCCM of a $Cl_2$ gas under a pressure of 0.05 Torr with a power of 0.08 $W/cm^2$ at a temperature of 100° C.

5. A method of making a metal plug in a connection hole in an insulating film, comprising the steps of:

depositing an adhesion layer on a surface of an insulating film;

etching away an area of said adhesion layer by isotropic etching through an opening in a resist mask, said area being larger than said opening in the resist mask;

thereafter etching said insulating film through the opening in the resist mask by anisotropic etching, forming a connection hole in said insulating film;

depositing a metal layer on said adhesion layer and in said connection hole; and etching back said metal layer, leaving the metal layer as a metal plug in said connection hole, and wherein said adhesion layer is deposited as a TiN film and etched with 30 SCCM of a $Cl_2$ gas under a pressure of 0.06 Torr with a power of 0.2 W/cm2.

6. A method according to claim 2, wherein said insulating film is etched by reactive ion etching with 80 SCCM of a $CHF_3$ gas under a pressure of 0.05 Torr with a power of 0.25 $W/cm^2$.

7. A method according to claim 2, wherein the metal layer comprises a blanket tungsten layer and is deposited by CVD with a gas of 30 SCCM of $WF_6$ and 360 SCCM of $SiH_4$ under a pressure of 80 Torr at a temperature of 475° C.

8. A method according to claim 2, wherein the metal layer comprises a blanket tungsten layer and is deposited by CVD first with a gas of 25 SCCM of $WF_6$ and 15 SCCM of $SiH_4$ under a pressure of 80 Torr at a temperature of 475° C., and then with a gas of 60 SCCM of $WF_6$ and 360 SCCM of $H_2$ under a pressure of 80 Torr at a temperature of 475° C.

9. A method of making a metal plug in a connection hole in an insulating film, comprising the steps of:

depositing an adhesion layer on a surface of an insulating film;

etching away an area of said adhesion layer by isotropic etching through an opening in a resist mask, said area being larger than said opening in the resist mask;

thereafter etching said insulating film through the opening in the resist mask by anisotropic etching, forming a connection hole in said insulating film;

depositing a metal layer on said adhesion layer and in said connection hole; and etching back said metal layer, leaving the metal layer as a metal plug in said connection hole, and further including the steps of:

forming a first wire as a diffused layer in a semiconductor layer;

depositing said insulating film on said semiconductor layer over said first wire before said adhesion layer is deposited on said insulating film;

forming said connection hole all the way through said insulating film to said first wire;

etching away said adhesion layer; and after said metal plug is left in said connection hole, forming a second wire on said insulating layer in electrically connected relationship to said metal plug.

10. A method according to claim 9, further including the steps of:

depositing a second insulating film on said semiconductor layer over said first wire before said insulating film is deposited on said semiconductor layer;

thereafter removing a region of said second insulating film which corresponds to said lower wire; and depositing a film in the removed region.

* * * * *